United States Patent [19]

Maeda et al.

[11] 4,371,956
[45] Feb. 1, 1983

[54] SEMICONDUCTOR DEVICE

[75] Inventors: Kohichi Maeda, Yokohama; Masanobu Yoshida, Kawaguchi, both of Japan

[73] Assignee: Fujitsu Limited, Kawasaki, Japan

[21] Appl. No.: 210,664

[22] Filed: Nov. 26, 1980

[30] Foreign Application Priority Data

Dec. 4, 1979 [JP] Japan .................... 54-157054

[51] Int. Cl.$^3$ ............................ G11C 11/40
[52] U.S. Cl. .................. 365/185; 365/210; 365/222
[58] Field of Search ............ 365/184, 185, 210, 222

[56] References Cited

U.S. PATENT DOCUMENTS

| | | | |
|---|---|---|---|
| 3,579,204 | 5/1971 | Lincoln | 340/173 |
| 3,938,108 | 2/1976 | Salsbury et al. | 340/173 |
| 4,063,224 | 12/1977 | Kirschner | 365/189 |
| 4,087,704 | 5/1978 | Mehta et al. | 307/262 |
| 4,090,258 | 5/1978 | Cricchi | 365/184 |
| 4,094,008 | 6/1978 | Lockwood et al. | 365/149 |
| 4,103,189 | 7/1978 | Perlegos et al. | 307/270 |
| 4,138,737 | 2/1979 | McCann | 365/78 |
| 4,200,918 | 4/1980 | Glock et al. | 365/210 |
| 4,223,394 | 9/1980 | Pathak et al. | 365/210 |

FOREIGN PATENT DOCUMENTS 2311382 12/1976 France .
2049327 12/1980 United Kingdom .

OTHER PUBLICATIONS

IBM Technical Disclosure Bulletin, vol. 17, No. 6, Nov. 1974, pp. 1811–1813, P. J. Krick Dual-Level Sense Scheme for Composite Insulator Memory Arrays.

*Primary Examiner*—George G. Stellar
*Attorney, Agent, or Firm*—Staas & Halsey

[57] ABSTRACT

A junction leakage current compensating circuit for a semiconductor memory device of a charge-storage type in which information can be erased by strong ultraviolet light is disclosed. The device comprises at least one dummy bit line connected to dummy cells incorporated with main memory cells and at least one compensating circuit for detecting the potential of the dummy bit line. The compensating circuit supplies compensating currents to bit lines connected to the main memory cells, responsive to the change of the potential of the dummy bit line.

6 Claims, 12 Drawing Figures

SEMICONDUCTOR DEVICE

BACKGROUND OF THE INVENTION

The present invention relates to a semiconductor memory device such as an EPROM (which is an abbreviation of an erasable and programmable read-only memory) device in which information can be erased by ultraviolet light and reprogrammed bit line by bit line with appropriate voltage pulses.

In general, a package for accommodating a chip on which a semiconductor device, such as an EPROM device, is formed with a window for receiving ultraviolet light. When it is necessary to erase the information stored in the EPROM, the entire chip is exposed to strong utlraviolet light which penetrates through the window into the EPROM.

Usually the EPROM is contained in a box to prevent any kind of light from penetrating thereinto. In addition, even during a no erasing mode, the EPROM can be used in a lighted room, since the intensity of the ultraviolet component of the room light is so small that the information stored in the EPROM is not erased.

However, as mentioned above, when the EPROM is in a lighted room, the light penetrates to the p-n junction portions formed by a substrate of one conductivity type and an impurity diffusion region of another conductivity type which serves as a source or a drain of a MIS (Metal-Insulator-Semiconductor) transistor, or a bit line. As a result, junction leakage current is generated therebetween so that the charge of the source or drain of the MIS transistor, or of the bit line is decreased. As a result, the potential of a sense line connected to a sense circuit is also decreased, so that the operation of the device deteriorates.

SUMMARY OF THE INVENTION

It is a principal object of the present invention to provide a semiconductor memory device capable of being reliably operated.

According to the present invention, there is provided a semiconductor memory device comprising: a substrate of a first conductivity type; a plurality of arrays of MIS main memory cells of a charge-storage type disposed on the substrate; a plurality of bit lines, each connected to one of the arrays of MIS main memory cells; at least one array of dummy memory cells of the same type as the MIS main memory cells being incorporated with the MIS main memory cells along the bit lines; at least one dummy bit line, each connected to one of the arrays of dummy memory cells, the dummy bit lines being of the same type as the bit lines; and at least one compensating circuit, each connected to one of the dummy bit lines and to at least one of the bit lines, for detecting the potential of the dummy bit lines so as to supply compensating currents to the bit lines and the dummy bit lines responsive to the potentials of the dummy bit lines. In this device, when the potentials of the bit lines and the dummy bit lines become low due to the penetration of light thereinto, charges are rapidly supplied to the bit lines and the dummy bit lines by the compensating circuit, so that the potentials of the bit lines and the dummy bit lines are restored. It should be noted that the compensating circuit is triggered by the potentials of the dummy bit lines, not by the potentials of the bit lines. This is helpful for reliable operation of the device.

BRIEF DESCRIPTION OF THE DRAWINGS

The present invention will be more clearly understood from the description as set forth below contrasting the present invention with the conventional device and with reference to the accompanying drawings, wherein.

DESCRIPTION OF THE PREFERRED EMBODIMENTS

Figure 1:
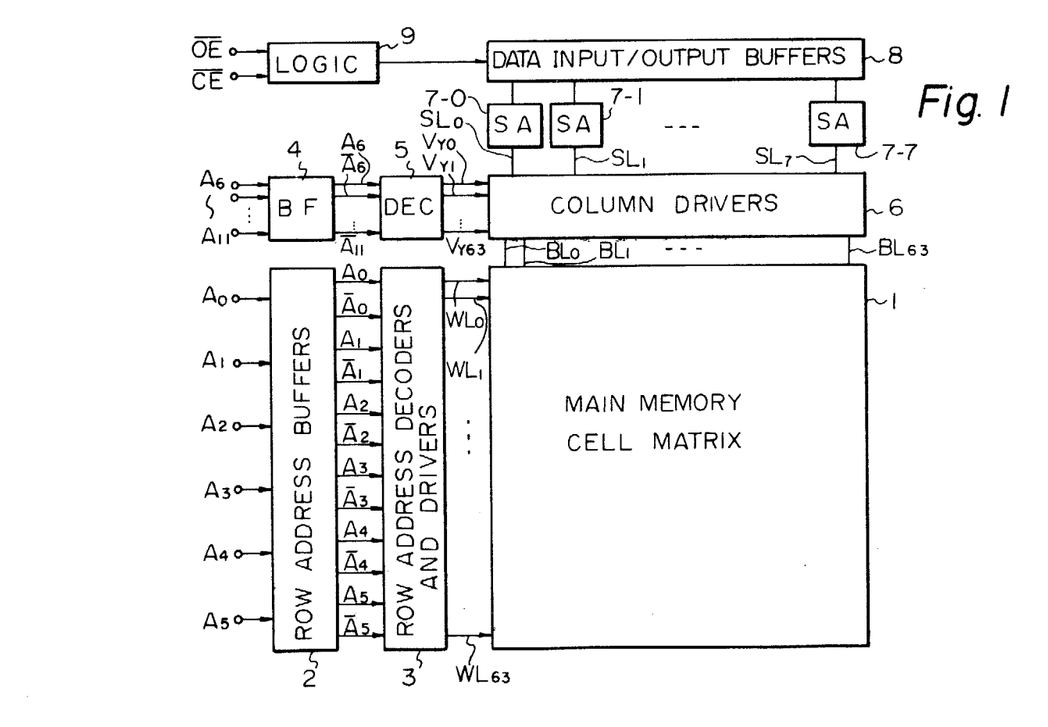
FIG. 1 is a block diagram of one conventional semiconductor memory device.

In FIG. 1, which illustrates one conventional memory device, the device comprises a main memory cell matrix 1 including, for example, $4096(=2^{12})$ memory cells of a charge-storage type such as FAMOS (floating-gate avalanche MOS) transistors. In such a floating-gate type cell, but carriers generated due to avalanche breakdown are injected into a floating-gate surrounded by an insulating material so that information is written in the cell. In order to erase the information stored in this cell, the cell is exposed to strong ultraviolet light. Therefore, the device is mounted in a package having a window for passing light to the mounted device.

The device of FIG. 1 further comprises row address buffers 2 for converting a TTL level of address signals $A_0, A_1, \ldots, A_5$ into a MOS level of address signals $A_0, A_1, \ldots, A_5$ and their inverted signals $\overline{A}_0, A_1, \ldots, A_5$; and row address decoders and drivers 3 for selecting one word line, that is, one row memory cell array, within the main memory cell matrix 1. Each row memory cell array is connected to one of the word lines $WL_0$ through $WL_{63}$. In addition, the device of FIG. 1 comprises column address decoders 4 for converting the TTL level address signals $A_6$ through $A_{11}$ into a MOS level of address signals $A_6$ through $A_{11}$ and their inverted signals $\overline{A}_6$ through $\overline{A}_{11}$; column decoders 5 for selecting one bit line, that is, one column memory cell array, within the main memory cell matrix 1; and column drivers 6 which are triggered by the column decoders 5. Each of the sense amplifiers 7-0, 7-1, ..., 7-7 is connected to eight bit lines through the column drivers 6. For example, the sense amplifier 7-0 is connected to the bit lines $BL_0$, $BL_1$, ..., $BL_7$. Furthermore, the sense amplifiers 7-0 through 7-7 are connected to data input/output buffers 8 which are also connected to a logic circuit 9 which receives signals $\overline{OE}$ and $\overline{CE}$.

The main memory cell matrix 1 will be explained in more detail.

Figure 2:
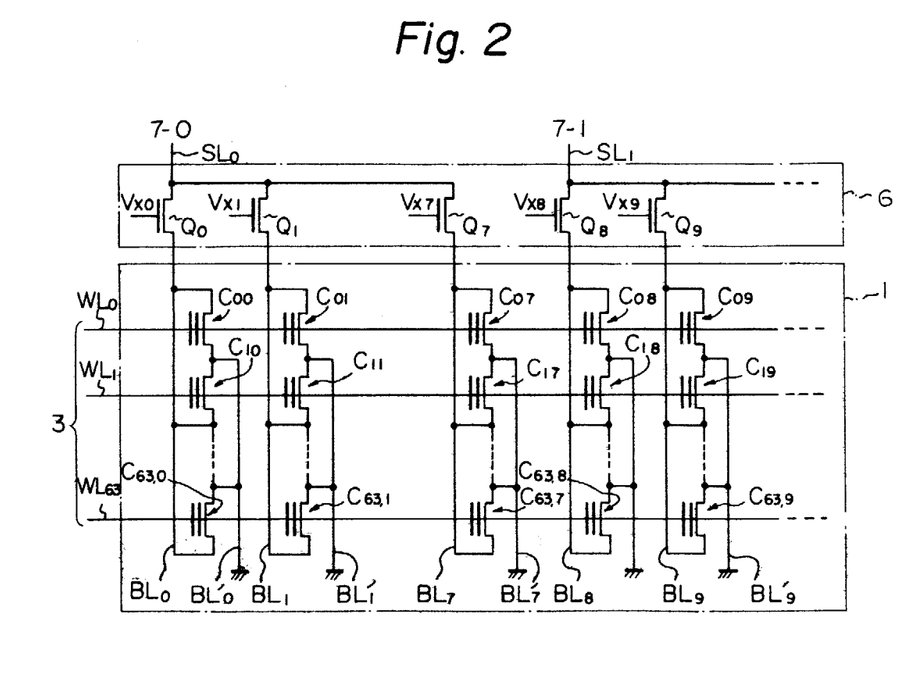
FIG. 2 is a circuit diagram of the main memory cell matrix 1 of FIG. 1.

FIG. 2 is a circuit diagram of the main memory cell matrix 1 of FIG. 1. In FIG. 2, each memory cell $C_{ij}$ (i, j=0 through 63) has a floating-gate, a control gate connected to one word line $WL_i$, a drain connected to one bit line $BL_j$ and a source connected to one bit line $BL_j'$ which is ground line. The bit lines $BL_0$, $BL_1$, ..., $BL_7$ are connected to drivers $Q_0$, $Q_1$, ..., which receive signals $V_{x0}$, $V_{x1}$, ..., $V_{x7}$, respectively.

Figure 3A:
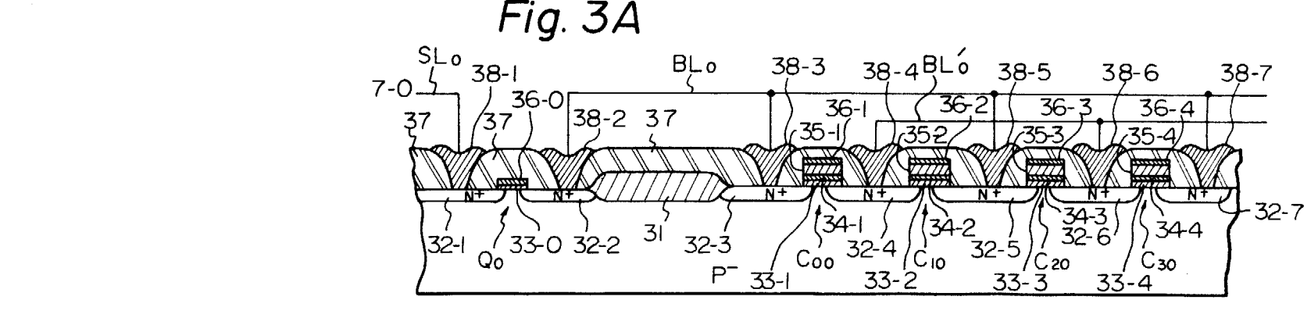
FIGS. 3A and 3B are cross-sectional views of examples of the first column memory cell array formed by the memory cells $C_{00}$, $C_{10}$, ..., $C_{63, 0}$ of FIG. 2.
Figure 3B:
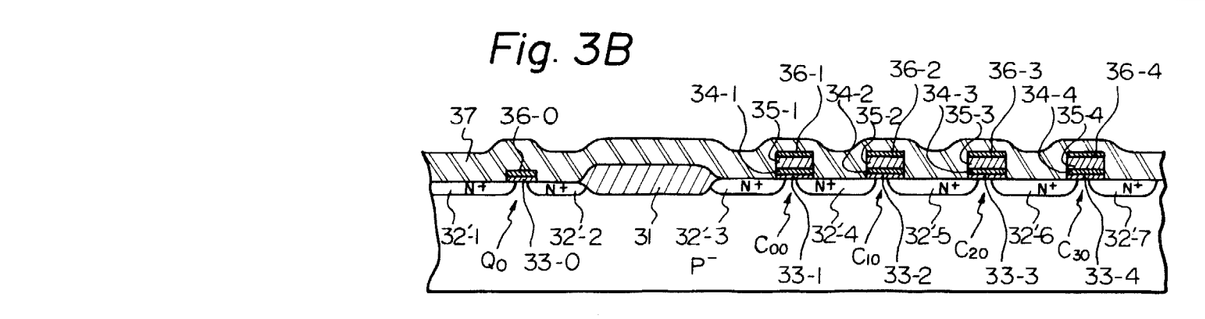

FIGS. 3A and 3B are cross-sectional views of examples of the first column memory cell array. Referring to FIG. 3A, a thick insulating layer 31 is provided on a p⁻ type substrate. In addition, in the substrate, n+ impurity diffusion regions 32-1 through 32-7 are formed. Further, a thin insulating layer 33-i (i=0–4) such as silicon oxide, a metal layer 34-i (i=1–4) such as polycrystalline silicon, a thin insulating layer 35-i (i=1–4) such as silicon oxide and a metal layer 36-i such as polycrystalline silicon (i=1, 2, 2, 3,4) are formed in this order, so that the cells $C_{00}$, $C_{10}$, $C_{20}$ $C_{30}$ are formed. A thin insulating layer 33-0 and a metal layer 36-0 form a driver $Q_0$ associated with the diffusion regions 32-1 and 32-2. Further, a thick insulating layer 37 made of, for instance, phosphosilicate glass is deposited and in addition, metal layers 38-1 through 38-7 made of, for instance, polycrystalline silicon or aluminum are deposited. In this case, the layer 38-1 is connected to a sense line $SL_0$, and the layers 38-2, 38-3, 38-5 and 38-7 are connected to the bit line $BL_0$ made of, for instance, aluminum, while the layers 38-4 and 38-6 are connected to the bit line $BL_0'$ (earth line). It should be noted that p-n junctions are formed between the diffusion regions 32-1 through 32-7 and the substrate. Therefore, when the device of FIG. 3A is exposed to light, junction leakage currents flow therethrough, so that the potential of the bit line $BL_0$ is decreased and accordingly, the potential of the sense line $SL_0$ is decreased. As a result, normal operation of the device cannot be expected.

In particular, in recent years, in order to enhance the integration density of the device, the bit lines are formed by diffusion regions, as illustrated in FIG. 3B. In FIG. 3B, a diffusion region 32'-1 serves as the sense line, and diffusion regions 32'-2, 32'-3, 32'-5 and 32'-7 serve as the bit line $BL_0$ of FIG. 3A while diffusion regions 32'-4 and 32'-6 serve as the bit line $BL_0'$ of FIG. 3A. As a result, the resistance of the bit lines becomes large. In addition, the conductance $g_m$ of the cells becomes small, since the impurity regions thereof become small. Further, in order to save power consumption, the difference in potential applied to the cells becomes small, so that the sensitivity of the sense amplifier $SL_i$ (i=0 through 7) of FIG. 1 must be high.

When light shines on a device having a structure as illustrated in FIG. 3B, junction leakage current is larger than that of the device having a structure as illustrated in FIG. 3A, since the bit line $BL_0$ also forms a p-n junction with the substrate. In addition, a small leakage current, for example, of the order of several tens of $\mu A$, causes the device to malfunction, since the sensitivity of the sense amplifiers is high. In particular, the high potential of the sense line $SL_i$ (i=0 through 7) cannot be discriminated.

Therefore, it is necessary to reduce the effect of junction leakage current caused by light penetrating the device. In the present invention, when such junction leakage current caused by light penetration is detected, charges are rapidly supplied to the bit lines, so that the potentials thereof can be prevented from being greatly reduced.

Figure 4:
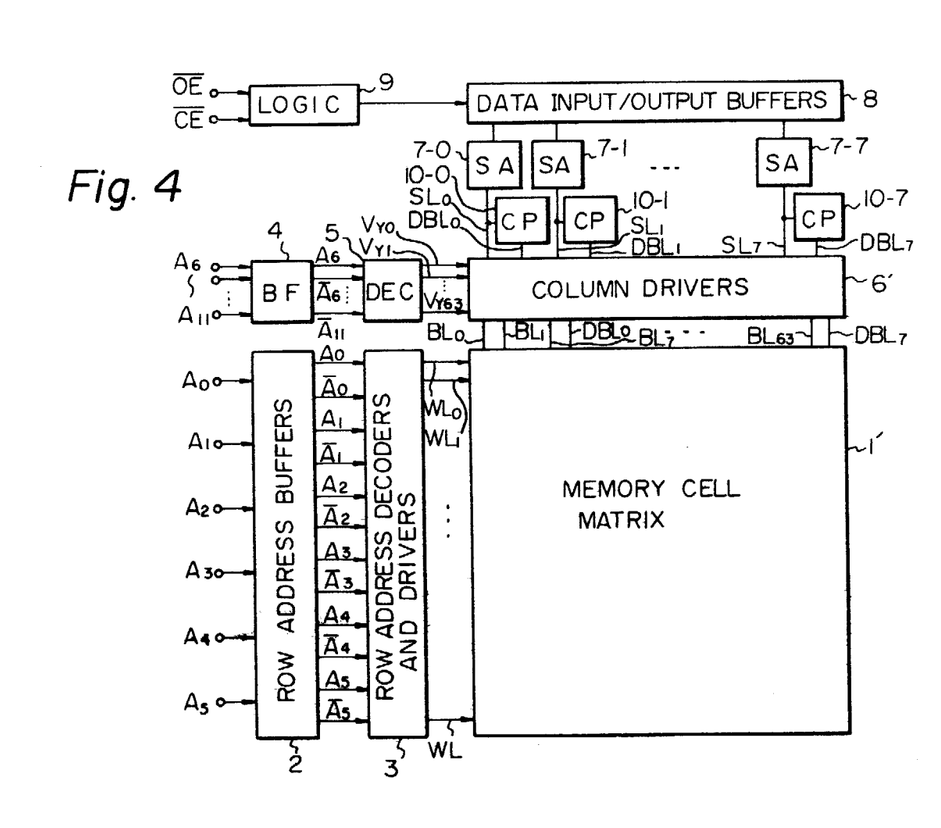
FIG. 4 is a block diagram of an embodiment of the semiconductor memory device according to the present invention.

FIG. 4 is a block diagram illustrating an embodiment of the semiconductor memory device according to the present invention. In FIG. 4, the elements which are the same as those of FIG. 1 are denoted by the same reference numerals. In FIG. 4, compensating circuits 10-0 through 10-7 are provided in addition to those in FIG. 1. Further, the memory cell matrix 1' comprises dummy memory cell arrays (not shown) in addition to the main memory cell matrix 1. The above-mentioned compensating circuits detect the changes of the potential of dummy bit lines connected to the dummy memory cell arrays so as to supply currents to the corresponding bit lines. Therefore, the changes of the potentials of the bit lines due to the junction leakage current induced by light penetration become small. The compensating circuits and the dummy memory cell arrays will now be explained in more detail.

Figure 5:
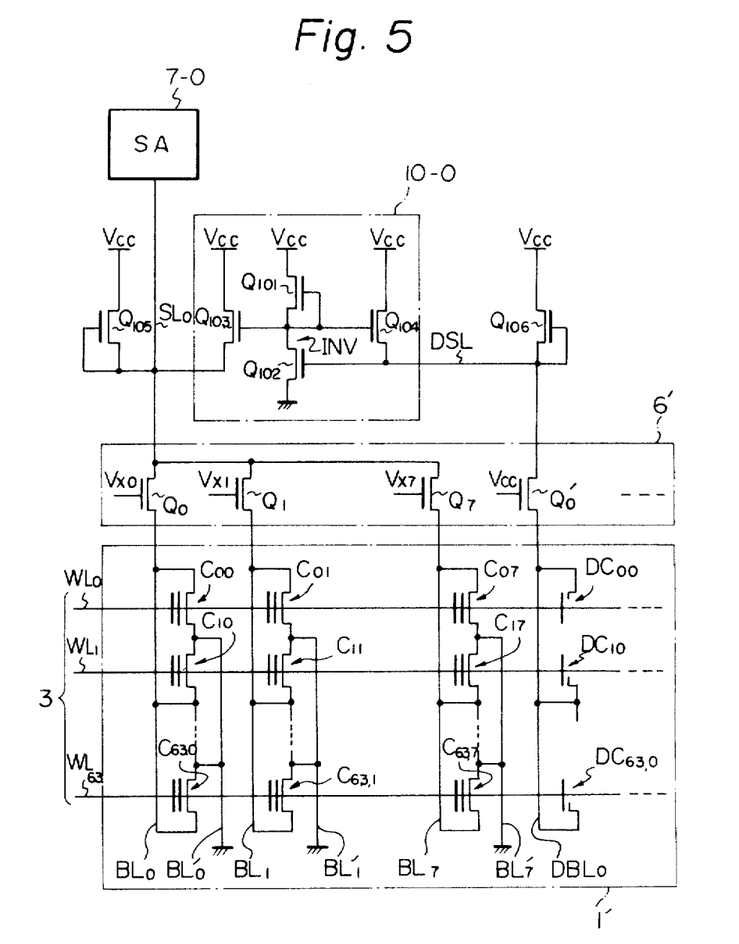
FIG. 5 is a circuit diagram of the memory cell matrix 1' and the compensating circuit 10-0 of FIG. 4.

FIG. 5 is a circuit diagram of the compensating circuit 10-0 and the memory cell matrix 1'. The memory cell matrix 1' comprises dummy memory cells $DC_{00}$, $DC_{10}$, ..., $DC_{63, 0}$ connected to a dummy bit line $DBL_0$, and other dummy memory cells $DC_{ij}$ (i=0 through 63, j=1 through 7) (not shown) connected to dummy bit lines $DBL_j$ (j=1 through 7) (not shown). The dummy memory cells are incorporated with the main memory cells along columns thereof. As a result, each change of the potentials of the bit lines $BL_0$, $BL_1$, ..., $BL_7$ is similar to that of the potential of the dummy bit line $DEL_0$. It should be noted that each of the dummy memory cells $DC_{00}$, $DC_{10}$, ..., $DC_{63, 0}$ has a drain but no source. This is because the sources of the memory cells $C_{00}$, $C_{10}$, ... are connected to the ground lines and the potentials thereof are stable. As a result, the monitoring of the earth lines is unnecessary and, accordingly, the sources of the dummy memory cells $DC_{00}$, $DC_{10}$, ..., $DC_{63, 0}$ are also unnecessary.

In addition, a transistor $Q_0'$ of the column driver 6' is provided in order to equalize the dummy bit line $DBL_0$ with each of the bit lines $BL_0$, $BL_1$, ..., $BL_7$.

The compensating circuit 10-0 comprises an inverter circuit INV formed by two MOS transistors $Q_{101}$ and $Q_{102}$ connected in series for detecting the potential of the dummy bit line $DBL_0$, and two compensating MOS transistors $Q_{103}$ and $Q_{104}$ for supplying compensating currents to the bit lines $BL_0$, $BL_1$, ..., $BL_7$; and the dummy bit line $DBL_0$, respectively. An input of the inverter circuit INV, that is, the gate of the transistor $Q_{102}$ is connected to the dummy bit line $DBL_0$ through a dummy sense line $DSL_0$, while an output of the inverter circuit INV is connected to the gates of the compensating transistors $Q_{103}$ and $Q_{104}$. In FIG. 5, transistors $Q_{105}$ and $Q_{106}$ are load transistors.

When light shines on the device including the circuit of FIG. 5, leakage currents are generated in the p-n junctions of the drain regions and the other impurity diffusion regions forming the bit lines, so that the potential of the dummy bit line $DBL_0$ is decreased. As a result, the potential of the output of the inverter INV is increased. Therefore, the impedances of the two compensating transistors $Q_{103}$ and $Q_{104}$ are decreased so as to supply compensating current to the bit lines $BL_0$, $BL_1$, ..., $BL_7$ and the dummy bit line $DBL_0$. Therefore, the potentials of the bit lines and the dummy bit line is gradually increased so as to increase the potential of the input of the inverter INV and accordingly, to decrease the impedances of the transistors $Q_{103}$ and $Q_{104}$. That is, the potentials of the bit lines $BL_0$, $BL_1$, ..., $BL_7$ are restored.

The quantities of the compensating currents are determined by the voltages applied to the gates of the compensating transistors $Q_{103}$ and $Q_{104}$. In this case, it is preferable that such gate voltages are a minimum level so that the sense amplifier 7-0 can read the high potential information of the sense line $SL_0$. In FIG. 5, the potential of the sense line $SL_0$ is the power supply voltage $V_{cc}$ minus a threshold voltage of the transistor $Q_{103}$. Similarly, the potential of the dummy sense line $DSL_0$ is the power supply voltage $V_{cc}$ minus a threshold voltage of the transistor $Q_{104}$.

In FIG. 5, it should be noted that the compensating circuit 10-0 detects the potential of the dummy sense line $DSL_0$, not the potential of the sense line $SL_0$. Even when the compensating circuit 10-0 detects the potential of the sense line $SL_0$, the junction leakage current is compensated. However, in this case, there is a problem in that the read-out information is also inverted, for example, low potential information is converted to high potential information.

Figure 6A:
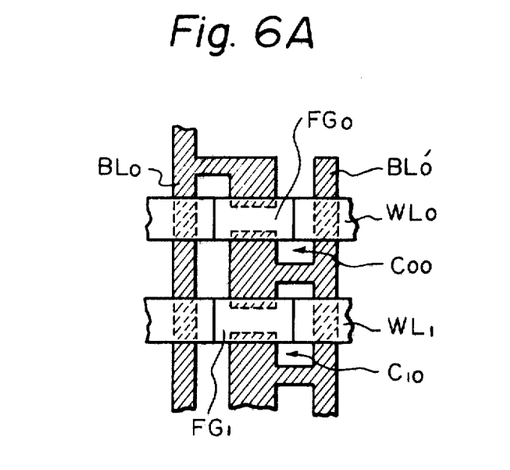
FIGS. 6A and 6B are plan views of the memory cells and the dummy memory cells, respectively, of FIG. 5.
Figure 6B:
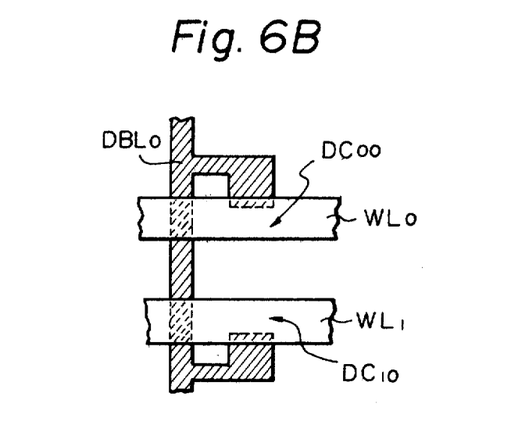

FIGS. 6A and 6B are plan views of the memory cells and the dummy cells, respectively, of FIG. 5. In FIG. 6A, the bit lines $BL_0$ and $BL_0'$ are formed by impurity diffusion regions, such as n+ type regions in the case of a p− type silicon substrate. Each impurity diffusion region is connected to source or drain regions of the memory cells $C_{00}$ and $C_{10}$. $FG_0$ and $FG_1$ indicate floating-gates disposed on the channel portions of the memory cells $C_{00}$ and $C_{10}$, respectively.

Contrary to the above, in FIG. 6B which illustrates the dummy memory cells, the bit line $BL_0'$, the source regions connected to the bit line $BL_0'$ and the floating-gates $FG_0$ and $FG_1$ are omitted, from the above-mentioned reasons.

Next, the simulation results with regard to the conventional device and the device according to the present invention will be explained.

Figure 7A:
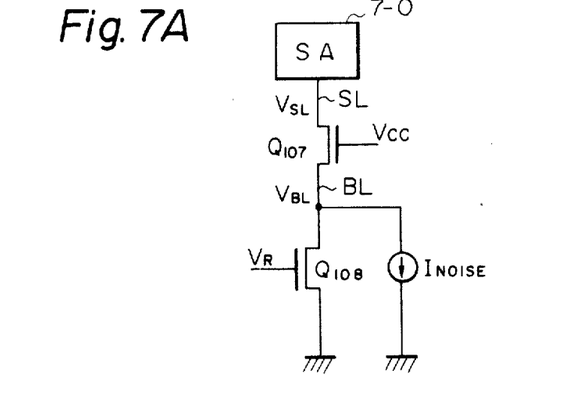
FIGS. 7A and 7B are circuit diagrams of simulation circuits according to the conventional art and the present invention, respectively.

FIG. 7A is a circuit diagram of a simulation circuit for the conventional device. In FIG. 7A, a transistor $Q_{107}$ which receives the high potential $V_{cc}$ is equivalent to one of the drivers $Q_0$ through $Q_7$ of FIG. 2, while a transistor $Q_{108}$ is equivalent to one of the memory cells of FIG. 2. Further, a current source $I_{NOISE}$ represents junction leakage current. A voltage applied to the gate of the transistor $Q_{108}$ is a rectangular voltage signal in which a high potential corresponds to the low potential $V_{SL}$ of a sense line SL and a low potential corresponds to the high potential $V_{SL}$ of the sense line SL.

Figure 8A:
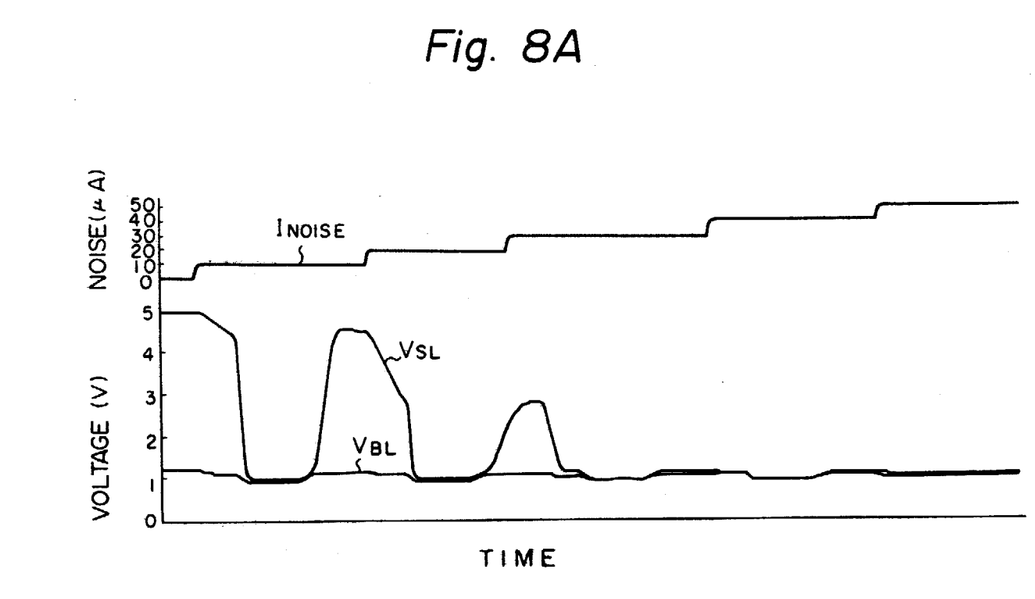
FIGS. 8A and 8B are timing diagrams of the signals appearing in the circuits of FIGS. 7A and 7B, respectively.

As illustrated in FIG. 8A, which depicts the operation of the circuit of FIG. 7A, when the leakage current $I_{NOISE}$ is increased, the potential $V_{BL}$ of a bit line BL is gradually decreased, however, the potential $V_{SL}$ is rapidly decreased which may cause failure in the read-operation of the sense amplifier 7-0.

Figure 7B:
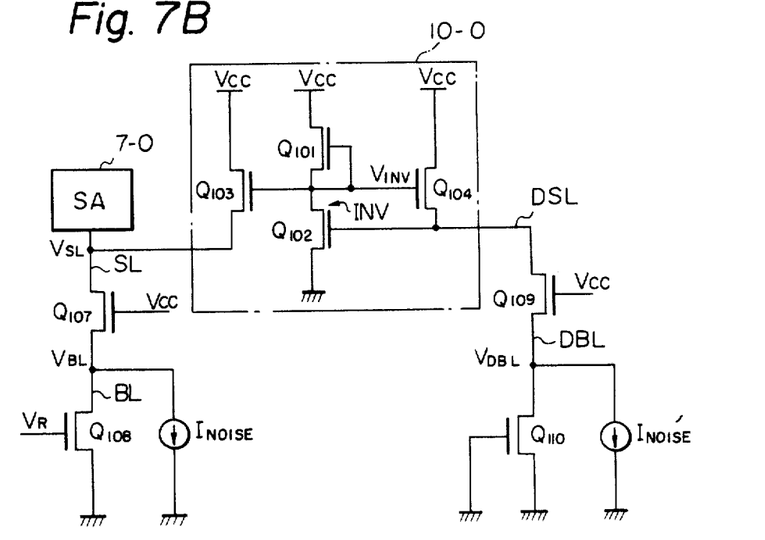

FIG. 7B is a circuit diagram of a simulation circuit for the device according to the present invention. In FIG. 7B, the compensating circuit 10-0, transistors $Q_{109}$ and $Q_{110}$, and a current source $I_{NOISE}'$ are provided in addition to the components of FIG. 7A. The transistor $Q_{109}$ is equivalent to the transistor $Q_0'$ of FIG. 5, while the transistor $Q_{110}$ is equivalent to one of the dummy memory cells $DC_{00}$, $DC_{10}$, . . . , $DC_{63, 0}$. The current source $I_{NOISE}'$ also corresponds to junction leakage current and therefore, the currents of the current sources $I_{NOISE}$ and $I_{NOISE}'$ are the same.

Figure 8B:
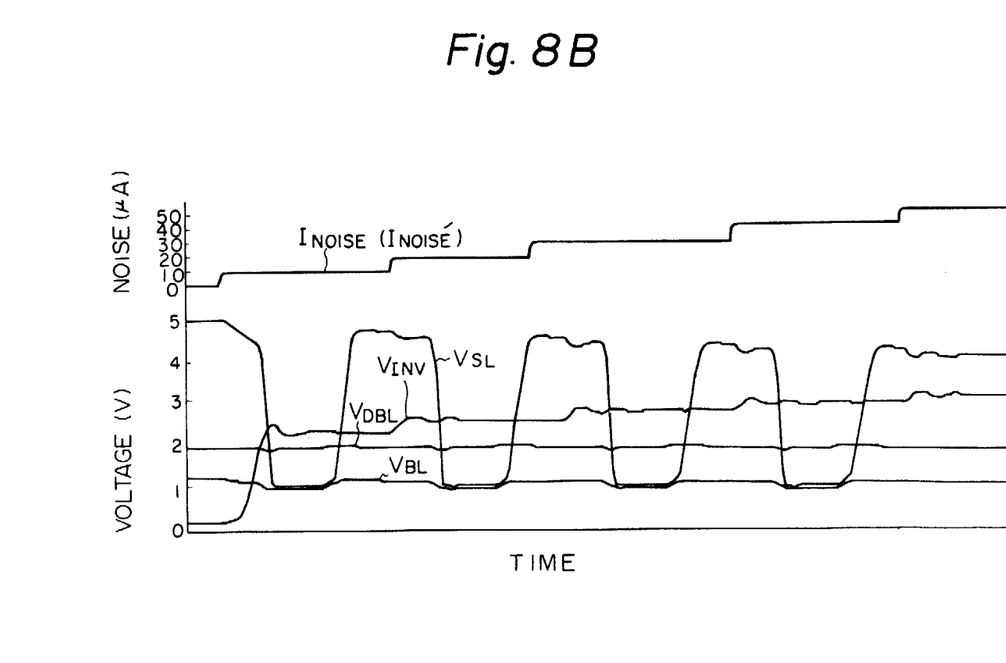

As illustrated in FIG. 8B, which depicts the operation of the circuit of FIG. 7B, when the leakage currents $I_{NOISE}$ and $I_{NOISE}'$ are increased, the potentials $V_{BL}$ and $V_{DBL}$ are gradually decreased. Therefore, the potential $V_{INV}$ of the inverter circuit INV is increased so that compensating currents supplied to the lines SL and DSL are also increased. As a result, the potential $V_{SL}$ is scarcely decreased even when the current $I_{NOISE}$ and $I_{NOISE}'$ is increased. This means that the junction leakage current is compensated.

As explained above, the semiconductor memory device according to the present invention has an advantage, as compared with the conventional device, in that the operation thereof is reliable, since junction leakage current is compensated.

We claim:

1. A semiconductor memory device comprising:
    a substrate of a first conductivity type;
    a plurality of arrays of MIS main memory cells of a charge-storage type disposed on said substrate;
    a plurality of bit lines, each connected to a respective one of said arrays of MIS main memory cells;
    at least one array of dummy memory cells of the same type as said MIS main memory cells arranged along one of said bit lines;
    at least one dummy bit line, connected to said at least one array of dummy memory cells, said at least one dummy bit line being of the same type as said bit lines; and
    at least one compensating circuit means, connected to said at least one dummy bit line and to at least one of said bit lines, for detecting the potential of said at least one dummy bit line and supplying compensating currents to said at least one of said bit lines and said at least one dummy bit line responsive to the potential of said at least one dummy line.

2. A device as set forth in claim 1, wherein said at least one compensating circuit comprises:
    an inverter circuit having an input connected to said at least one dummy bit line;
    a first compensating MIS transistor having an input connected to an output of said inverter circuit and having an output connected to said at least one of said bit lines; and
    a second compensating MIS transistor having an input connected to the output of said inverter and having an output connected to said at least one dummy bit line.

3. A device as set forth in claim 1, wherein said MIS main memory cells of a charge-storage type are of a floating-gate type.

4. A device as set forth in claim 1 or 3, wherein said bit lines and said at least one dummy bit line are formed by metal connection layers deposited on said substrate.

5. A device as set forth in claim 1 or 3, wherein said bit lines and said at least one dummy bit line are formed by impurity diffusion regions of a second conduction type in said substrate.

6. A device as set forth in claim 2, wherein said device is operatively connected to receive a power supply voltage, and wherein said at least one compensating circuit further comprises:
    a first load transistor having a gate connected to the output of said first compensating MIS transistor and a source connected to said gate of said first load transistor, and having a drain operatively connected to receive the power supply voltage,
    a second load transistor having a gate connected to said output of said second compensating MIS transistor a source connected to said gate of said second load transistor, and having a drain operatively connected to receive the power supply voltage.

* * * * *